(12) United States Patent
Kim (10) Patent No.: US 7,554,149 B2
(45) Date of Patent: Jun. 30, 2009

(54) FLASH MEMORY DEVICES COMPRISING PILLAR PATTERNS AND METHODS OF FABRICATING THE SAME

(75) Inventor: Dong-Chan Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 385 days.

(21) Appl. No.: 11/287,364

(22) Filed: Nov. 28, 2005

(65) Prior Publication Data

US 2006/0138522 A1 Jun. 29, 2006

(30) Foreign Application Priority Data

Dec. 23, 2004 (KR) .................. 10-2004-0111398

(51) Int. Cl.
*H01L 29/788* (2006.01)
(52) U.S. Cl. .................. 257/315; 257/39; 257/391; 257/E21.682; 257/E27.103; 257/E29.129

(58) Field of Classification Search ................. 257/315, 257/390, 391, 261, E21.682, E27.103, E29.129
See application file for complete search history.

(56) References Cited

U.S. PATENT DOCUMENTS

| 6,380,032 B1 * | 4/2002 | Lee et al. ................... 438/257 |
| 6,682,977 B2 | 1/2004 | Chang |
| 2004/0099900 A1 * | 5/2004 | Iguchi et al. ................ 257/315 |

FOREIGN PATENT DOCUMENTS

KR 10-2004-70650 A 8/2004

* cited by examiner

*Primary Examiner*—Sue Purvis
*Assistant Examiner*—Fazli Erdem
(74) *Attorney, Agent, or Firm*—Volentine & Whitt, PLLC

(57) ABSTRACT

Flash memory devices include pillar patterns formed between selected pairs of floating gates and control gate extensions that penetrate between selected pairs of floating gates are provided. Methods of fabricating the flash memory devices are also provided.

13 Claims, 8 Drawing Sheets

FLASH MEMORY DEVICES COMPRISING PILLAR PATTERNS AND METHODS OF FABRICATING THE SAME

BACKGROUND OF THE INVENTION

1. Field of the Invention

The present invention relates to semiconductor memory devices and methods of fabricating the same, and more particularly, to flash memory devices and methods of fabricating the same.

A claim of priority is made to Korean Patent Application No. 2004-111398, filed Dec. 23, 2004, the subject matter of which is hereby incorporated by reference in its entirety.

2. Description of the Related Art

Semiconductor memory devices that store data can be generally categorized as either volatile memory devices or nonvolatile memory devices. A volatile memory device will lose its stored data when no power is supplied to the device, whereas a nonvolatile memory device will retain its stored data when no power is supplied to the device. Accordingly, nonvolatile memory devices, for example, flash memory devices, are widely employed in mobile telecommunication systems, memory cards, and so forth.

A flash memory device comprises cell transistors for storing data, and a driving circuit for driving the cell transistors. The cell transistors are formed in a cell region of a semiconductor substrate while the driving circuit is formed in a peripheral circuit region of the semiconductor substrate. Typically, there are millions (or more) of the cell transistors formed in the cell region of the semiconductor substrate. A flash memory device can be classified as a NOR flash memory device or a NAND flash memory device based on the structure of its cell array. The cell array structure of the NOR flash memory device allows random access to cell transistors. The cell array structure of the NAND flash memory device is defined by strings of cell transistors in the cell region of the device. Each string is composed of an even number of cell transistors arranged and connected in a line of an active region. For example, each string may be composed of thirty-two cell transistors.

Figure 1:
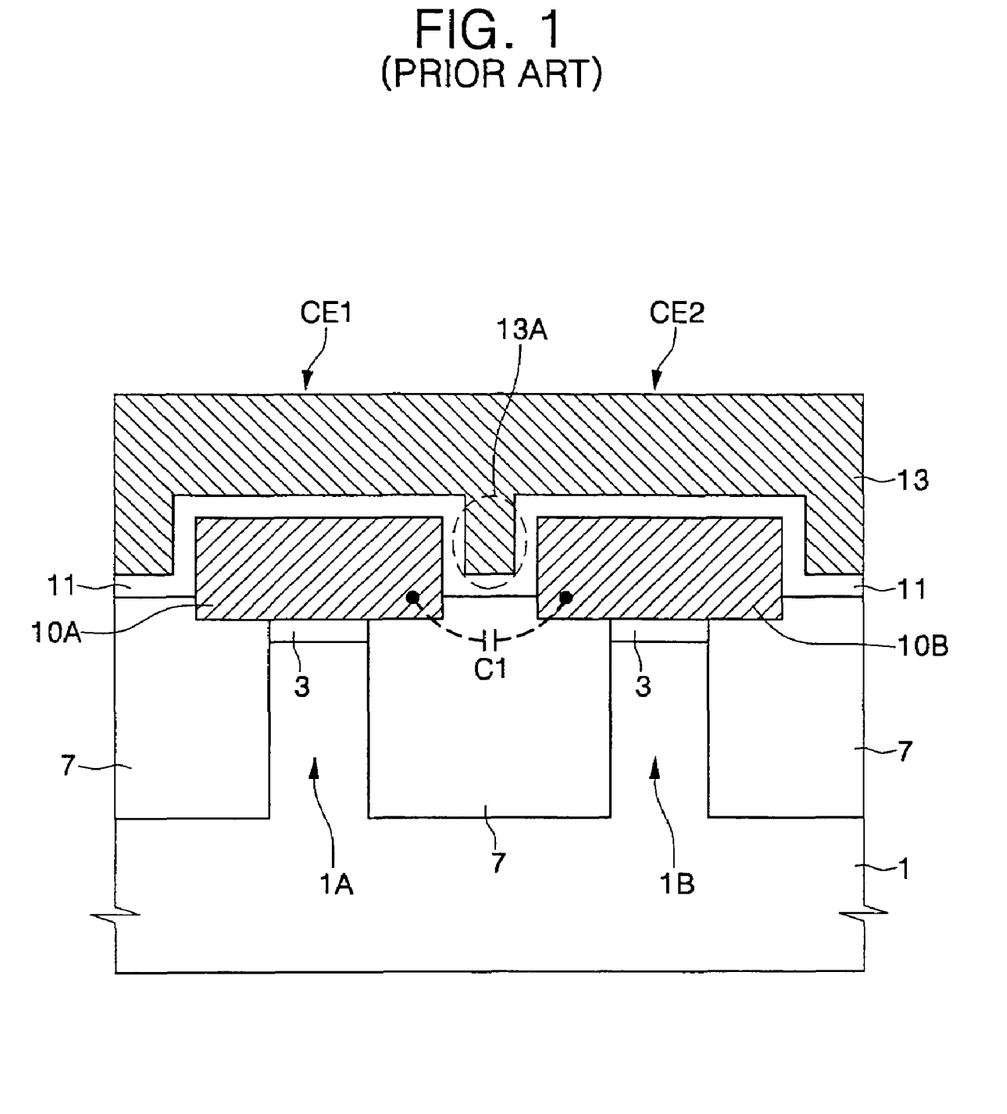
FIG. 1 is a cross-sectional view illustrating a conventional NAND flash memory device, where the plane of cross-section is perpendicular to the word line.

FIG. 1 is a cross-sectional view illustrating a conventional NAND flash memory device, where the plane of cross-section is perpendicular to the word line.

Referring to FIG. 1, an isolation layer 7 is formed in a predetermined region of a semiconductor substrate 1. The isolation layer 7 defines (i.e., separates) first and second active regions 1A and 1B, which are parallel to each other. A control gate electrode 13 is formed to cross over the first and second active regions 1A and 1B. The control gate electrode 13 acts as a word line.

Floating gates 10A and 10B are interposed between the control gate electrode 13 and the active regions 1A and 1B, respectively. That is, the first floating gate 10A is interposed between the control gate electrode 13 and the first active region 1A, and the second floating gate 10B is interposed between the control gate electrode 13 and the second active region 1B. The floating gates 10A and 10B are insulated from the control gate electrode 13 by an inter-gate dielectric layer 11. Furthermore, the floating gates 10A and 10B are insulated from the active regions 1A and 1B by a tunnel dielectric layer 3. In addition, the control gate electrode 13 has a control gate extension 13A interposed between the floating gates 10A and 10B.

Cell transistors CE1 and CE2 are formed at intersections of the control gate electrode 13 and the active regions 1A and 1B, respectively. That is, the first cell transistor CE1 is formed at an intersection of the control gate electrode 13 and the first active region 1A, and the second cell transistor CE2 is formed at an intersection of the control gate electrode 13 and the second active region 1B.

A top surface of the isolation layer 7 is typically positioned higher than bottom surfaces of the floating gates 10A and 10B as shown in FIG. 1. In this case, parasitic coupling capacitors, which employ the isolation layer 7 as a dielectric layer, may be formed between the floating gates 10A and 10B. For example, a coupling capacitor C1 is formed between the first and second floating gates 10A and 10B, which each have a side that faces the other and have the isolation layer 7 interposed in between, as shown in FIG. 1.

The capacitance of the coupling capacitor C1 increases as a distance between the floating gates 10A and 10B decreases. In addition, the capacitance of the coupling capacitor C1 increases as an effective cross-sectional area facing between the floating gates 10A and 10B increases. That is, as the degree of integration of the NAND flash memory device increases, the coupling capacitance between the floating gates 10A and 10B (i.e., the inter-floating gate coupling capacitance) increases. In this case, when the first cell transistor CE1 is selectively programmed, electrons are injected into the first floating gate 10A to change an electric potential of the first floating gate 10A, and an electric potential of the second floating gate 10B adjacent to the first floating gate 10A also changes due to the coupling capacitor C1. As a result, a threshold voltage of the second cell transistor CE2 changes. Accordingly, a string which includes the second cell transistor CE2 may malfunction in a read operation mode.

In order to improve the coupling capacitor C1, methods of extending the control gate extension 13A to a level lower than bottom surfaces of the floating gates 10A and 10B have been researched.

A NAND flash memory device associated with the inter-floating gate coupling capacitance and a method of fabricating the same are disclosed by Iguchi et al. in "Semiconductor device and method of manufacturing the same" (U.S. patent publication No. 2004/0099900 A1). According to Iguchi et al., a plurality of control gate electrodes is formed to cross over a plurality of parallel active regions, and floating gates are interposed between the control gate electrodes and the active regions. The floating gates are insulated from the active regions by a tunnel dielectric layer. Each of the control gate electrodes has extensions which penetrate an isolation layer between the floating gates and are lower than top surfaces of the active regions.

However, a process of partially etching the isolation layer to be removed is required in order to form the extensions. The process of partially etching the isolation layer includes a wet etching process and a dry etching process. It is very difficult to control an etching depth when using the wet etching process, and thus the process may result in harm to the NAND flash memory device. For example, when over-etching occurs, the tunneling dielectric layer is damaged. The dry etching process uses the floating gates as etch masks. When using the dry etching process, the floating gates and the tunneling dielectric layer may be damaged due to plasma.

SUMMARY OF THE INVENTION

According to an aspect of the present invention, a flash memory device which includes an isolation layer formed in a semiconductor substrate and defining a plurality of parallel active regions, a plurality of floating gates formed above the active regions and having widths which are larger than widths of the active regions, pillar patterns having sidewalls and bottom surfaces covered by the isolation layer, and disposed lower than bottom surfaces of the floating gates, and a plurality of control gate electrodes overlapping the floating gates and crossing over the active regions. Each of the control gate electrodes includes control gate extensions which penetrate between the floating gates and are disposed above the pillar patterns.

In accordance with another aspect of the present invention, a NAND flash memory device is provided which includes an isolation layer formed in a semiconductor substrate and defining a plurality of parallel active regions, a string select line and a ground select line crossing over the active regions, a plurality of floating gates arranged between the string select line and the ground select line, disposed above the active regions, and having widths which are larger than widths of the active regions, pillar patterns having sidewalls and bottom surfaces covered by the isolation layer, and disposed lower than bottom surfaces of the floating gates, and a plurality of control gate electrodes overlapping the floating gates and crossing over the active regions. Each of the control gate electrodes includes control gate extensions which penetrate between the floating gates and are formed above the pillar patterns.

In accordance with yet another aspect of present invention, a method of fabricating a flash memory device is provided which includes forming a plurality of parallel trench mask patterns on a semiconductor substrate, etching the semiconductor substrate using the trench mask patterns as etch masks to form a trench region defining a plurality of parallel active regions, forming an isolation layer and a pillar filling the trench region, where sidewalls and a bottom surface of the pillar are covered by the isolation layer. The method further includes removing the trench mask patterns to form grooves exposing the active regions, forming insulated floating gate patterns filling the grooves, selectively etching the pillar to form recessed regions between the floating gate patterns, sequentially forming an inter-gate dielectric layer and a control gate conductive layer on the semiconductor substrate having the recessed regions, and continuously patterning the control gate conductive layer, the inter-gate dielectric layer, and the floating gate patterns to form floating gates interposed between control gate electrodes and the active regions as well as the plurality of control gate electrodes crossing over the active regions. Each of the control gate electrodes has control gate extensions which penetrate between the floating gates.

BRIEF DESCRIPTION OF THE DRAWINGS

Exemplary embodiments of the invention will be described with reference to the accompanying drawings, in which like reference symbols refer to like elements. The drawings are not necessarily to scale, emphasis being placed upon illustrating the principles of the invention instead. In the drawings.

DETAILED DESCRIPTION OF PREFERRED EMBODIMENTS

Herein, when a layer is described as being formed "on" a substrate or another layer, the layer may be formed directly on the substrate or other layer, or intervening layers may be present.

Figure 2:
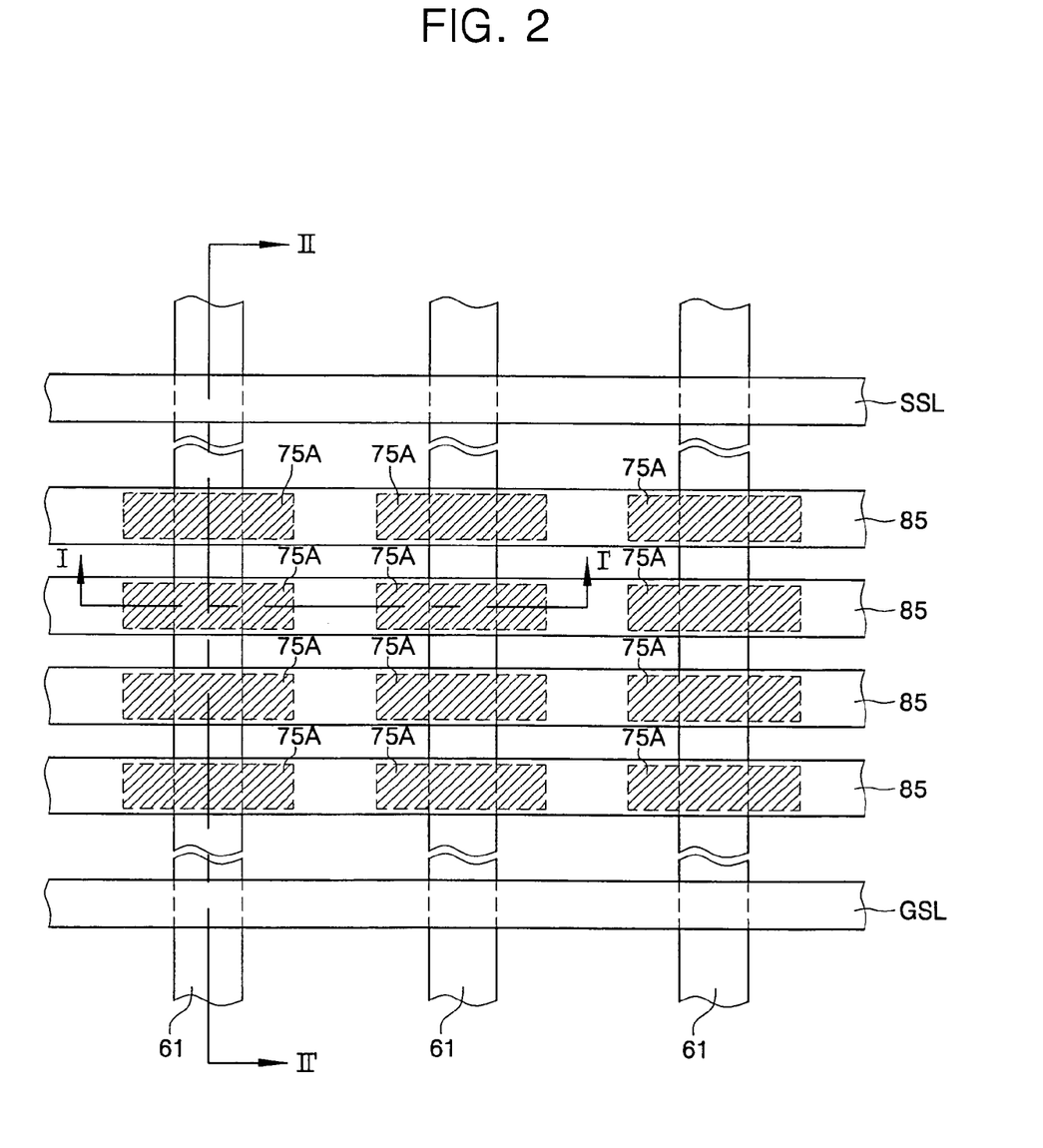
FIG. 2 is a plan view of portions of a cell array region of a NAND flash memory device in accordance with an exemplary embodiment of the present invention.
Figure 3:
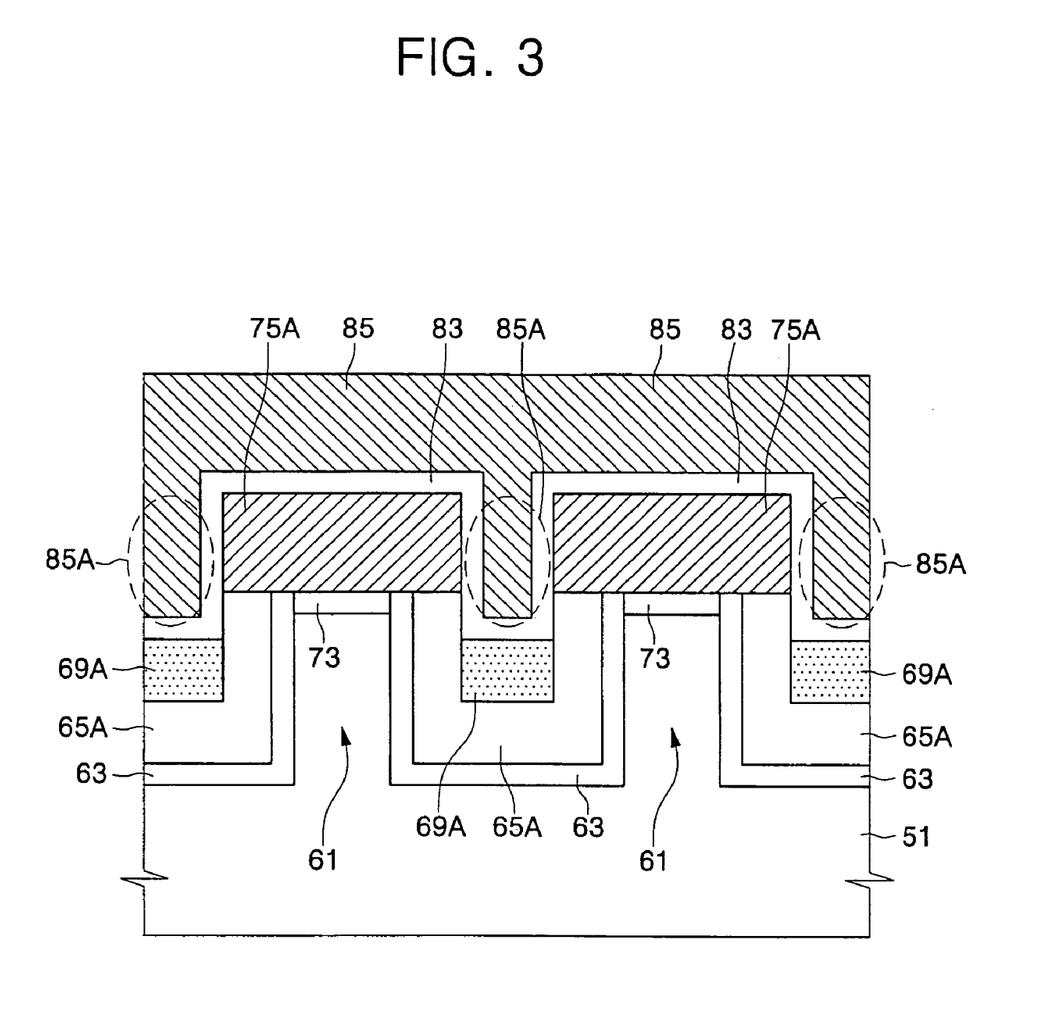
FIG. 3 is a cross-sectional view of the portion of the NAND flash memory device of FIG. 2 denoted by the line I-I' of FIG. 2, where the plane of cross section is perpendicular to the direction of the arrows I and I' of FIG. 2.
Figure 4:
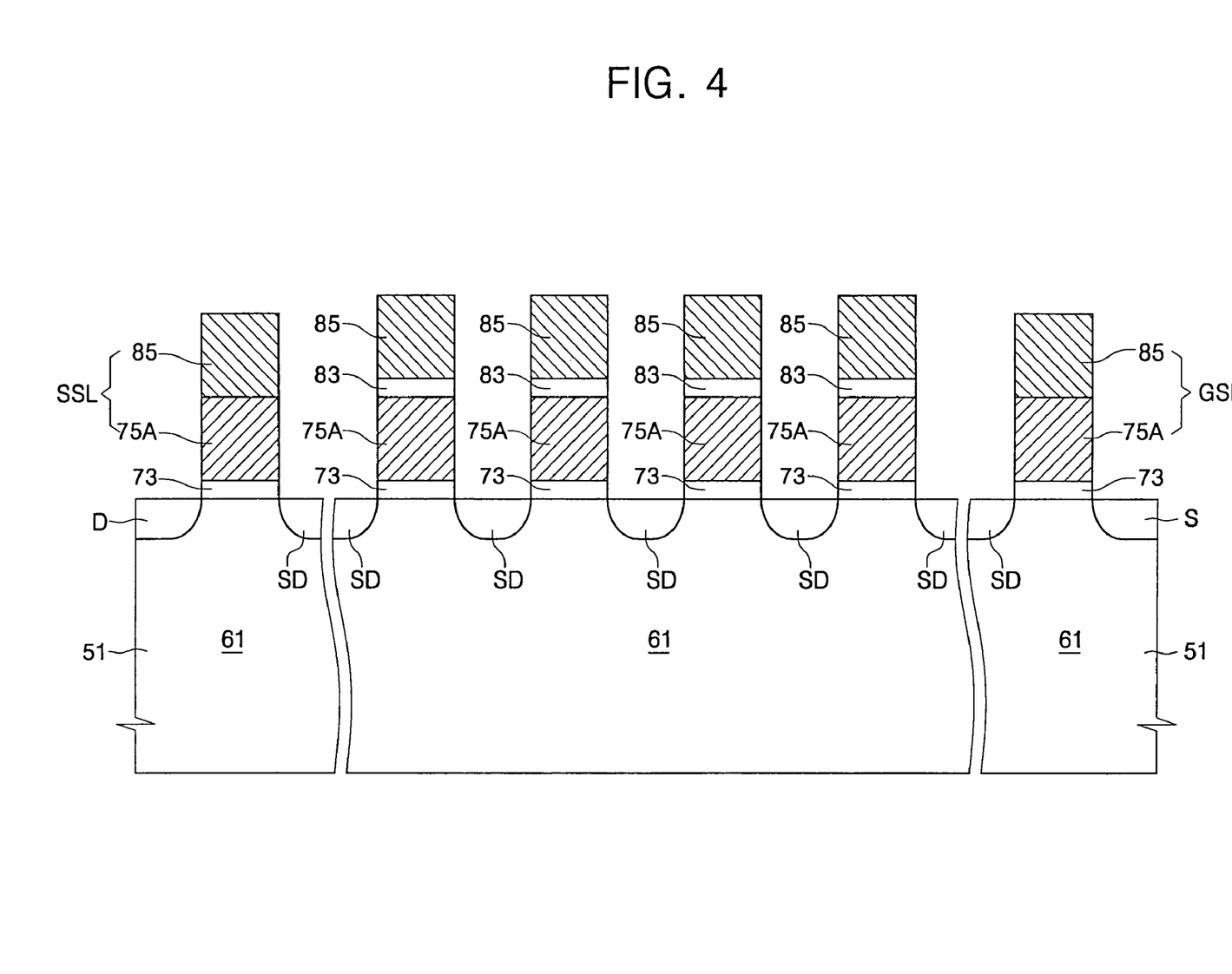
FIG. 4 is a cross-sectional view of the portion of the NAND flash memory device of FIG. 2 denoted by the line II-II' of FIG. 2, where the plane of cross section is perpendicular to the direction of the arrows II and II' of FIG. 2.

FIG. 2 is a plan view of a portion of a cell array region of a NAND flash memory device in accordance with an exemplary embodiment of the present invention. In addition, FIG. 3 is a cross-sectional view of the portion of the NAND flash memory device of FIG. 2 denoted by the line I-I' of FIG. 2, where the plane of the cross section is perpendicular to the direction of the arrows I and I' of FIG. 2. FIG. 4 is a cross-sectional view of the portion of the NAND flash memory device of FIG. 2 denoted by the line II-II' of FIG. 2, where the plane of cross section is perpendicular to the direction of the arrows II and II' of FIG. 2.

Referring to FIGS. 2, 3, and 4, trench regions are formed in a semiconductor substrate 51 to define (i.e., separate, or outline) a plurality of parallel active regions 61. An isolation layer 65A is formed in the trench regions of the semiconductor substrate 51. Each of the active regions 61 may have the shape of a trapezoid, wherein the bottom width is larger than the top width. However, for simplicity of description, it will be assumed hereinafter that each active region 61 has the shape of a rectangle, wherein the bottom width is equal to the top width. The isolation layer 65A may be an isolation layer which covers inner walls (i.e., the sidewalls and the bottoms) of trench regions. Sidewall oxide layers 63 may be formed between the active regions 61 and the isolation layer 65A. However, the sidewall oxide layers 63 may be omitted. Pillar patterns 69A are formed within the isolation layer 65A. That is, sidewalls and bottom surfaces of the pillar patterns 69A may be covered by the isolation layer 65A. Top surfaces of the pillar patterns 69A are preferably formed at a level lower than top surfaces of the active regions 61. The pillar patterns 69A are preferably insulating layers that have an etch selectivity with respect to the isolation layer 65A.

A string select line SSL and a ground select line GSL may be formed to cross over the active regions 61. The string select line SSL and the ground select line GSL may be formed parallel with each other, as shown in FIG. 2.

A plurality of control gate electrodes 85 are formed to cross over the active regions 61 between the string select line SSL and the ground select line GSL. In addition, a plurality of floating gates 75A are interposed between the control gate electrodes 85 and the active regions 61. That is, the floating gates 75A are arranged in a two-dimensional manner along rows parallel with the control gate electrodes 85 and columns parallel with the active regions 61. The floating gates 75A are insulated from the active regions 61 by tunneling dielectric layers 73. Each floating gate 75A preferably has a width larger than the width of each active region 61. In accordance with embodiments of the present invention, the floating gates 75A may each have a rectangular cross-section, as seen in the cross-sectional view of FIG. 3. In addition, the top surfaces of the floating gates 75A may be flat.

An inter-gate dielectric layer 83 is interposed between the floating gates 75A and the control gate electrodes 85. The inter-gate dielectric layer 83 may also be present between the control gate electrodes 85 and the isolation layer 65A.

Each of the control gate electrodes 85 includes a plurality of control gate extensions 85A which penetrate between the floating gates 75A and are disposed above the pillar patterns 69A. That is, for each control gate electrode 85, the control gate extensions 85A are disposed above the pillar patterns 69A, are connected to the control gate electrode 85, and penetrate between the floating gates 75A that are arranged along the row parallel with the control gate electrode 85. In this case, the inter-gate dielectric layer 83 may be interposed between the pillar patterns 69A and the control gate extensions 85A.

As described above, the pillar patterns 69A are formed within the isolation layer 65A. Top surfaces of the pillar patterns 69A may be lower than bottom surfaces of the floating gates 75A. Lower regions of the control gate extensions 85A preferably extend to a level lower than the bottom surfaces of the floating gates 75A. In this case, the control gate extensions 85A may penetrate between the floating gates 75A and extend into the isolation layer 65A. Accordingly, the control gate extensions 85A shield an electric field resulting from a potential difference between floating gates 75A that are adjacent along the row parallel to a control gate electrode 85, even when the adjacent floating gates 75A have different electric potentials. That is, the control gate extensions 85A can significantly reduce a parasitic coupling capacitance between the floating gates 75A.

Impurity regions, i.e., source and drain regions SD can be formed within the active regions 61. That is, the source and drain regions SD can be formed within the active regions 61 between the floating gates 75A. Consequently, cell transistors can be formed at intersections of the control gate electrodes 85 and the active regions 61.

Referring to FIG. 4, the string select line SSL may include floating gates 75A and a control gate electrode 85, which are sequentially stacked. Tunneling dielectric layers 73 may be interposed between the string select line SSL and an active region 61. In this case, a tunneling dielectric layer 73 can act as a gate dielectric layer of a string select transistor. In addition, the ground select line GSL may comprise floating gates 75A and a control gate electrode 85, which are sequentially stacked. Tunneling dielectric layers 73 may also be interposed between the ground select line GSL and an active region 61. In this case, a tunneling dielectric layer 73 can act as a gate dielectric layer of a ground select transistor.

Bit line impurity regions D may be formed within the active regions 61 at areas adjacent to the string select line SSL and positioned on the opposite side of the string select line SSL relative to the ground select line GSL. Common source regions S may be formed within the active regions 61 at areas adjacent to the ground select line GSL and positioned on the opposite side of the ground select line GSL relative to the string select line SSL. Consequently, string select transistors can be formed at intersections of the string select line SSL and the active regions 61, and ground select transistors can be formed at intersections of the ground select line GSL and the active regions 61. The bit line impurity regions D act as drain regions of the string select transistors and the common source regions S act as source regions of the ground select transistors.

Figure 12:
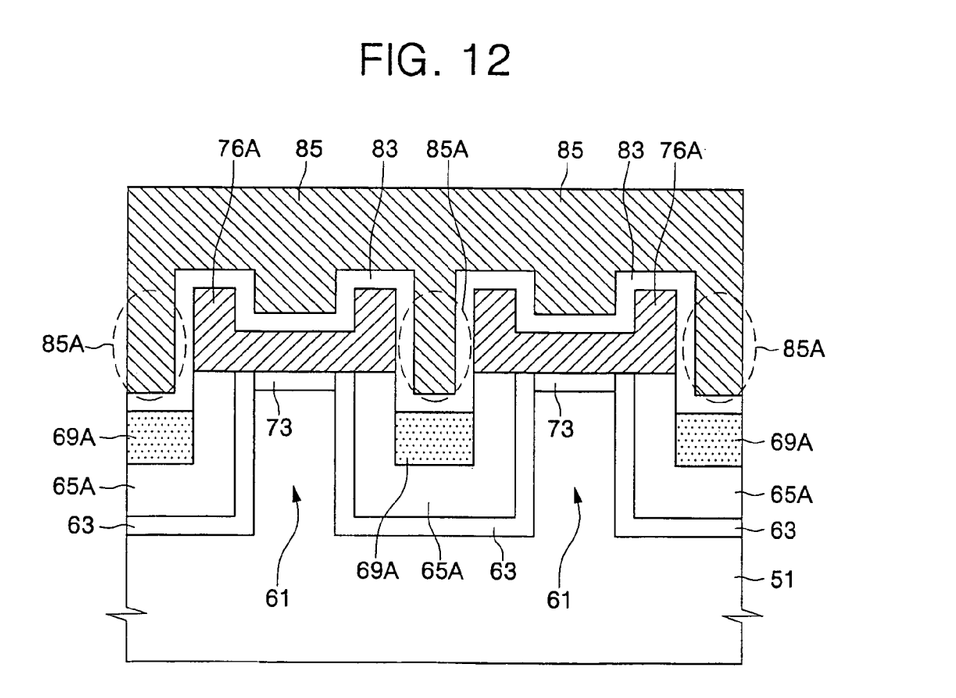

FIG. 12 is a cross-sectional view of a NAND flash memory device in accordance with another exemplary embodiment of the present invention. The exemplary embodiment of the NAND flash memory device illustrated in FIG. 12 has a structure similar to that of the exemplary embodiment illustrated in FIG. 3. The exemplary embodiments illustrated in FIGS. 3 and 12 each include the active regions 61, the tunneling dielectric layers 73, the sidewall oxide layers 63, the isolation layer 65A, and the pillar patterns 69A. The following brief description of the exemplary embodiment illustrated in FIG. 12 will be directed primarily to those portions of the embodiment that differ from the exemplary embodiment illustrated in FIG. 3.

Referring to FIG. 12, the NAND flash memory device may include at least one floating gate groove 77 on the top surface of each floating gate 76A. A plurality of control gate electrodes 85 is formed such that each gate electrode 85 crosses over the active regions 61. In this case, the control gate electrodes 85 may also extend into the floating gate grooves 77. An inter-gate dielectric layer 83 is interposed between the floating gates 76A and the control gate electrodes 85. In addition, the inter-gate dielectric layer 83 may also be interposed between the floating gates 76A and the portions of the control gate electrode 85 that are within the floating gate grooves 77. The floating gate grooves 77 act to increase the effective surface areas that face between the floating gates 76A and the control gate electrodes 85. That is, the floating gate groove acts to increase the coupling rate between the floating gates 76A and the control gate electrodes 85.

Hereinafter, methods of fabricating exemplary NAND flash memory devices in accordance with exemplary embodiments of the present invention will be described.

FIGS. 5 through 8 are cross-sectional views of the portion of the NAND flash memory device of FIG. 2 denoted by the line I-I' of FIG. 2 that illustrate stages in methods of fabricating NAND flash memory devices in accordance with exemplary embodiments of the present invention, wherein the plane of cross section is perpendicular to the direction of the arrows I and I' of FIG. 2.

Figure 5:
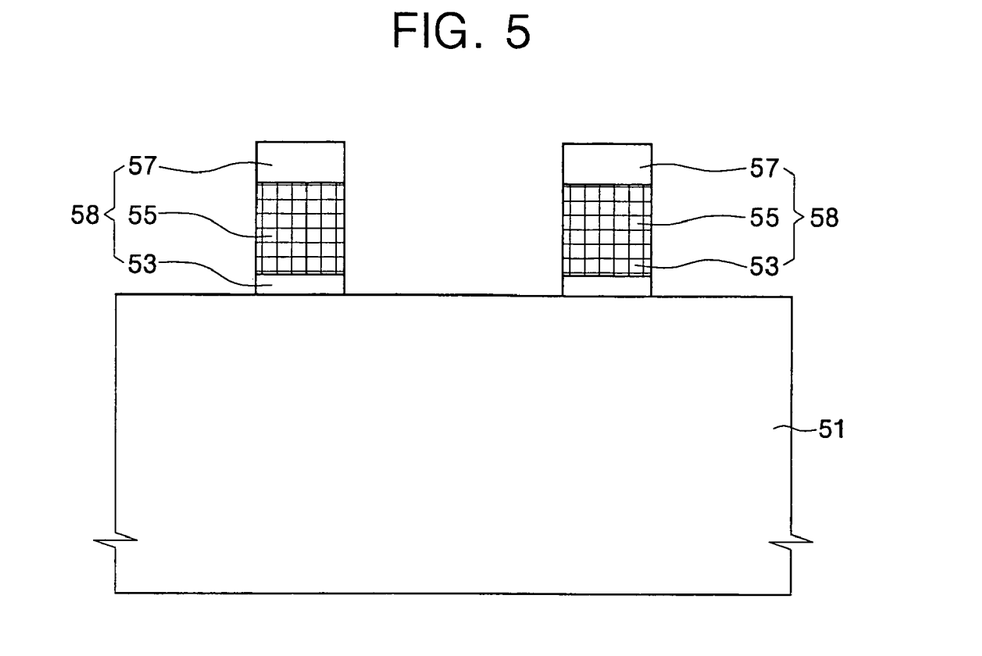
FIGS. 5 through 8 are cross-sectional views of the portion of the NAND flash memory device of FIG. 2 denoted by the line I-I' of FIG. 2 that illustrate stages in methods of fabricating NAND flash memory devices in accordance with exemplary embodiments of the present invention, where the plane of cross section is perpendicular to the direction of the arrows I and I' of FIG. 2.

Referring to FIG. 5, a trench mask layer is formed on a semiconductor substrate 51. The trench mask layer may be formed by sequentially stacking a buffer layer, a chemical mechanical polish stop, and a hard mask layer. However, the process of forming the hard mask layer may be skipped. The buffer layer can be formed to alleviate physical stress resulting from a difference between the thermal expansion coefficients of the chemical mechanical polish stop and the semiconductor substrate 51. The buffer layer may be formed of silicon oxide material such as a thermal oxide material. The chemical mechanical polish stop may be formed of polysilicon. In addition, the hard mask layer may be an insulating layer having an etch selectivity with respect to the chemical mechanical polish stop and the semiconductor substrate 51 and, for example, may be formed of silicon oxynitride (SiON) through a chemical vapor deposition (CVD) method. The hard mask layer can act to suppress diffused reflection in a photolithography process to facilitate formation of a fine pattern. When the hard mask layer is formed of silicon oxynitride (SiON) and the chemical mechanical polish stop is formed of polysilicon, the hard mask layer can also act to prevent the chemical mechanical polish stop from being thermally oxidized.

The hard mask layer, the chemical mechanical polish stop, and the buffer layer are continuously patterned to form a plurality of parallel trench mask patterns 58 which leave predetermined regions of the semiconductor substrate 51 exposed. Consequently, each of the trench mask patterns 58 can be formed so that it comprises a buffer layer pattern 53, a chemical mechanical polish stop pattern 55, and a hard mask pattern 57, which are sequentially stacked. When the process of forming the hard mask layer is skipped, each of the trench mask patterns 58 can be formed so that it includes the buffer layer pattern 53 and the chemical mechanical polish stop pattern 55, which are sequentially stacked. The patterning process may include forming a photoresist pattern on the trench mask layer, and etching the trench mask layer to form the plurality of parallel trench mask patterns using the photoresist pattern as an etch mask.

Figure 6:
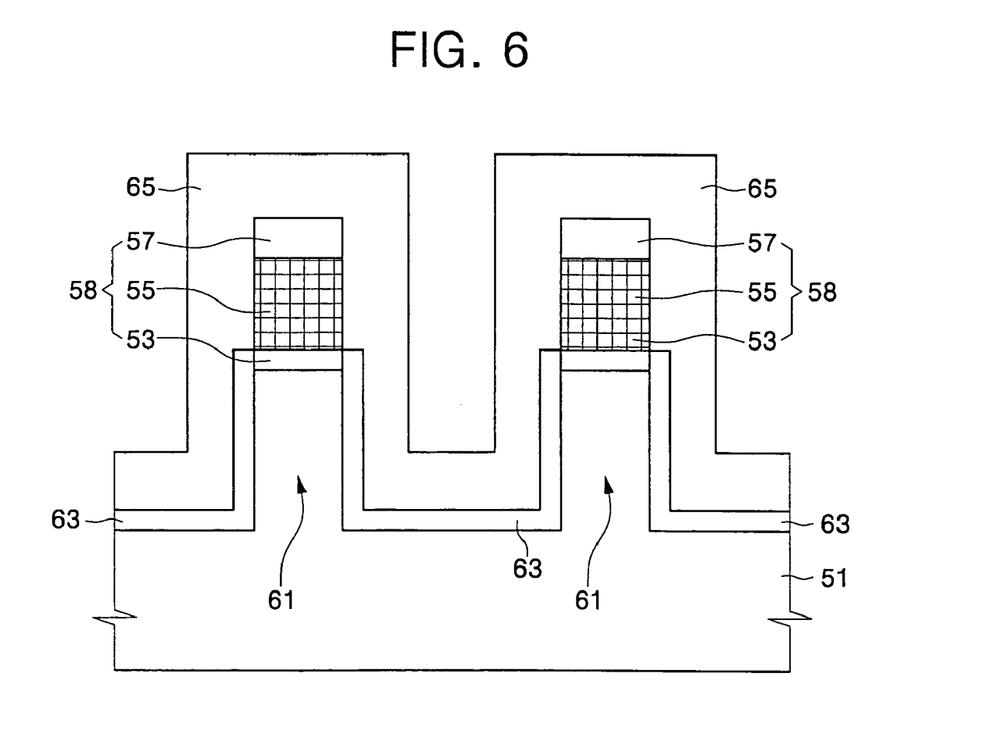

Referring to FIG. 6, the semiconductor substrate 51 is etched using the trench mask patterns 58 as etch masks to form trench regions. The trench regions define the plurality of parallel active regions 61. Sidewall oxide layers 63 may be formed on sidewalls of the active regions 61. The sidewall oxide layers 63 may be formed of silicon oxide using a thermal oxidation technique. Alternatively, the sidewall oxide layers 63 may be omitted. An insulating layer 65 is formed which completely covers the sidewall oxide layers 63 and the trench mask patterns 58. That is, the insulating layer 65 may be formed on the sidewall oxide layers 63, and formed to surround top surfaces and sidewalls of the trench mask patterns 58. When the sidewall oxide layers 63 are omitted, the insulating layer 65 may be formed to cover inner walls of the trench region. The insulating layer 65 may be formed of silicon oxide through a CVD method or a high density plasma CVD (HDPCVD) method.

Figure 7:
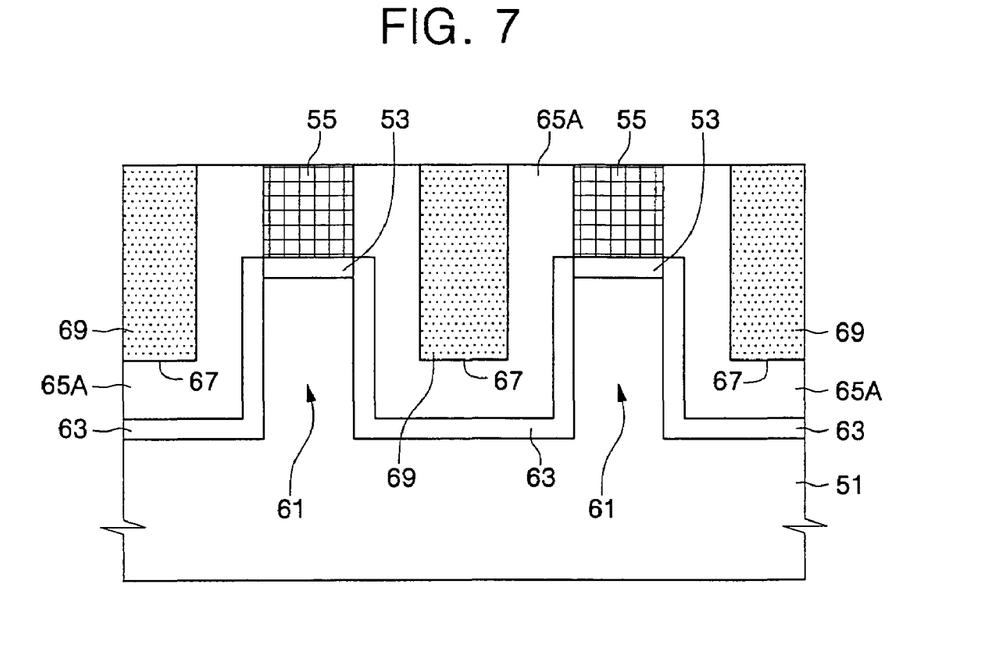

Referring to FIGS. 6 and 7, a pillar layer is formed to completely fill the remaining opening in each of the trench regions and cover the entire surface of the semiconductor substrate 51. The pillar layer is preferably formed of a material having an etch selectivity with respect to the insulating layer 65. For example, when the insulating layer 65 is formed of silicon oxide, the pillar layer may be formed of silicon nitride (SiN) through a CVD method.

To form pillars 69 and an isolation layer 65A, the insulating layer 65 and the pillar layer are planarized until top surfaces of the chemical mechanical polish stop patterns 55 are exposed. A chemical mechanical polishing (CMP) process which employs the chemical mechanical polish stop patterns 55 as stops may be applied in during the planarization process. Consequently, top surfaces of the pillars 69, the isolation layer 65A, and the chemical mechanical polish stop patterns 55 can be exposed on substantially the same plane. Referring to FIGS. 5, 6, and 7, when the trench mask patterns 58 comprise the hard mask patterns 57, the hard mask patterns 57 can be removed during the planarization process.

Lower regions 67 of the pillars 69 are preferably lower than top surfaces of the active regions 61.

Figure 8:
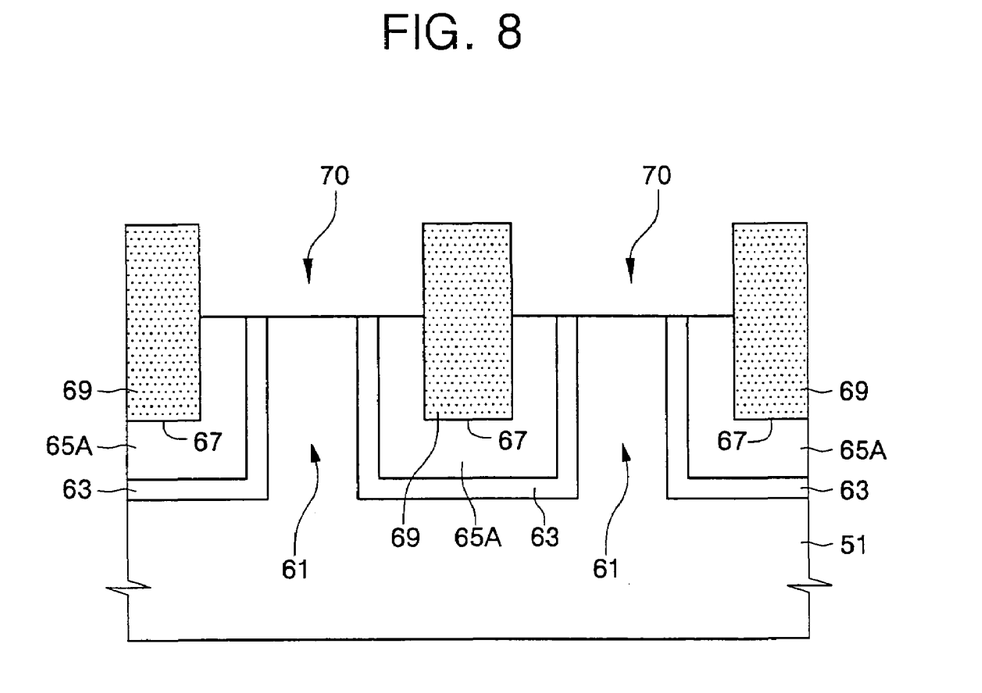

Referring to FIGS. 7 and 8, the chemical mechanical polish stop patterns 55 are selectively removed to expose the buffer layer patterns 53. When the chemical mechanical polish stop patterns 55 are formed of polysilicon, the chemical mechanical polish stop patterns 55 can be removed using a poly etchant or a poly dry etching process. Subsequently, the buffer layer patterns 53 are removed to form grooves 70 in which the active regions 61 are exposed. When the buffer layer patterns 53 are formed of a silicon oxide material such as a thermal oxide material, the buffer layer patterns 53 may be removed using an oxide etchant such as a wet etchant containing fluoric acid. In addition, when the buffer layer patterns 53 and the isolation layer 65A are formed of silicon oxide, the isolation layer 65A is isotropically etched while the buffer layer patterns 53 are removed. However, the pillars 69 are not etched because they are formed of a material such as silicon nitride which has an etch selectivity with respect to the isolation layer 65A. Consequently, the grooves 70 can be formed to have widths larger than the widths of the top surfaces of the active regions 61. In addition, a top surface of the isolation layer 65A can be adjusted to be formed on the same level as the top surfaces of the active regions 61 or on a level lower than the top surfaces of the active regions 61. In addition, an upper region of each pillar 69 may protrude from the top surface of the isolation layer 65A, and a lower region of each pillar 69 may remain within the isolation layer 65A. That is, the lower region of each pillar 69 may be surrounded by the isolation layer 65A.

Figure 9:
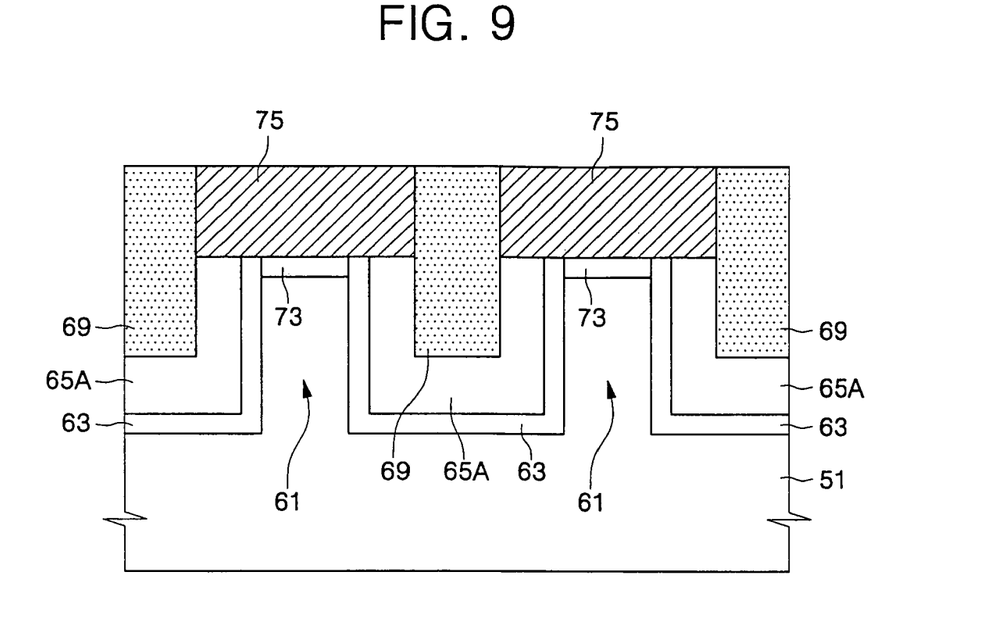
FIGS. 9 and 10 are cross-sectional views of the portion of the NAND flash memory device of FIG. 2 denoted by the line I-I' of FIG. 2 that illustrate stages in a method of fabricating a NAND flash memory device in accordance with one exemplary embodiment of the present invention, where the plane of cross section is perpendicular to the direction of the arrows I and I' of FIG. 2.
Figure 10:
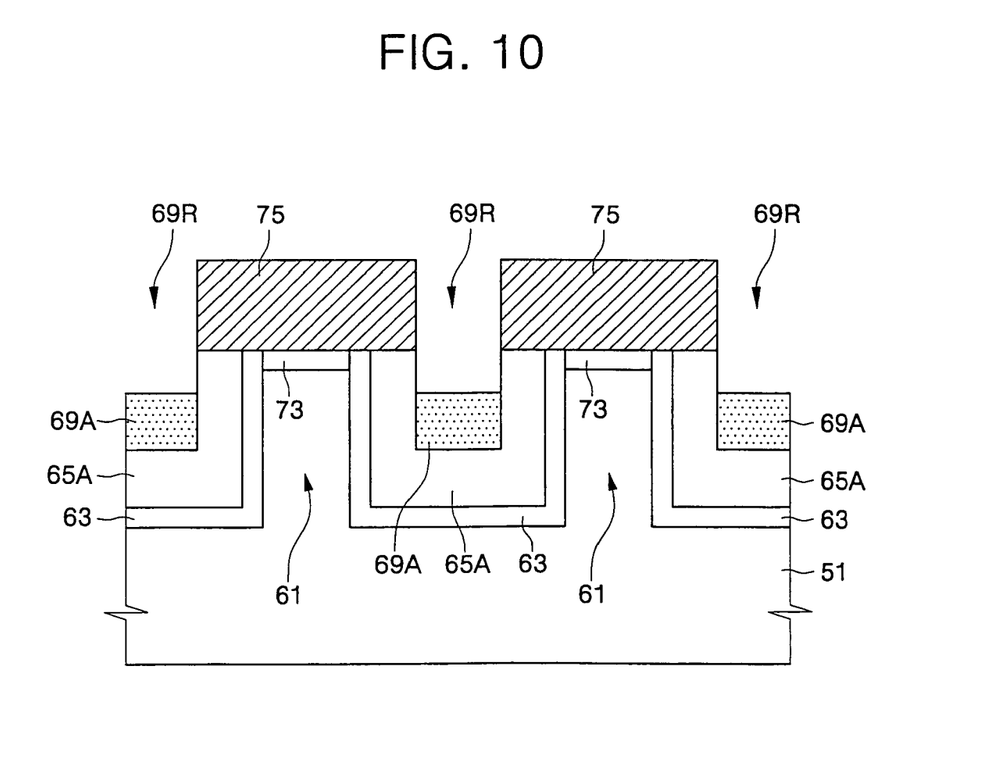

FIGS. 9 and 10 are cross-sectional views of the portion of the NAND flash memory device of FIG. 2 denoted by the line I-I' of FIG. 2 that illustrate stages in a method of fabricating a NAND flash memory device in accordance with one exemplary embodiment of the present invention, where the plane of cross section is perpendicular to the direction of the arrows I and I' of FIG. 2.

Referring to FIGS. 8 and 9, the tunneling dielectric layers 73 are formed on the exposed surfaces of the active regions 61. The tunneling dielectric layers 73 may be formed using a thermal oxidation technique. A floating gate conductive layer is formed on the semiconductor substrate 51 having the tunneling dielectric layers 73. The floating gate conductive layer may be formed of doped polysilicon. The floating gate conductive layer is planarized to expose top surfaces of the pillars 69. A CMP process which employs the pillars 69 as stops can be applied in during the planarization process. Consequently, floating gate patterns 75 including top surfaces that are flat can be formed within the grooves 70, and the floating gate patterns 75 can have widths larger than the widths of the top surfaces of the active regions 61.

Referring to FIGS. 9 and 10, the pillars 69 are selectively etched to form recessed regions 69R between the floating gate patterns 75. When the pillars 69 are formed of silicon nitride, the pillars 69 may be selectively removed by a wet etching process using a phosphoric acid ($H_3PO_4$) solution. In addition, the isolation layer 65A may be exposed at regions below the floating gate patterns 75 once the pillars 69 have been selectively etched. The isolation layer 65A is formed of a material such as silicon oxide which has an etch selectivity with respect to the pillars 69. In this case, the phosphoric acid ($H_3PO_4$) solution has a high etch rate with respect to silicon nitride. That is, the pillars 69 can prevent the isolation layer 65A from being damaged by the etching while the pillar 69 is selectively etched. Consequently, the pillar 69 can be selectively etched to form pillar patterns 69A. In this case, top surfaces of the pillar patterns 69A can be formed lower than bottom surfaces of the floating gate patterns 75. In addition, sidewalls and bottom surfaces of the pillar patterns 69A may be covered by the isolation layer 65A. Also, the pillars 69 may be completely removed. When the pillars 69 are completely removed, the isolation layer 65A is exposed within the recessed regions 69R.

A method of forming the control gate electrode 85 will now be described with additional reference back to FIGS. 3 and 4.

Referring to FIGS. 2, 3, and 4, the inter-gate dielectric layer 83 and the control gate conductive layer are sequentially formed on the semiconductor substrate 51 having the recessed regions 69R of FIG. 10. The control gate conductive layer, the inter-gate dielectric layer 83, and the floating gate patterns 75 are continuously patterned to form floating gates 75A interposed between the control gate electrodes 85 and the active regions 61 as well as a plurality of control gate electrodes 85 crossing over the active regions 61.

The inter-gate dielectric layer 83 may be formed of a multi-layer material such as oxide/nitride/oxide (O/N/O), aluminum oxide ($Al_2O_3$), hafnium oxide ($HfO_2$), $HfO_2/Al_2O_3$, or silicon oxide ($SiO_2$)/$HfO_2$/$Al_2O_3$, and the control gate conductive layer may be formed of doped polysilicon or polycide. The inter-gate dielectric layer 83 may be formed to cover top surfaces and sidewalls of the floating gate patterns 75. In addition, the inter-gate dielectric layer 83 may extend to cover the top surfaces of the pillar patterns 69A. When the pillars 69 are completely removed, the inter-gate dielectric layer 83 may extend to cover the isolation layer 65A.

Control gate extensions 85A are formed above the pillar patterns 69A while the control gate electrodes 85 are formed. That is, the control gate extensions 85A are formed to penetrate between the floating gates 75A above the pillar patterns 69A and are connected to the control gate electrodes 85. Lower regions of the control gate extensions 85A preferably extend to a level lower than bottom surfaces of the floating gates 75A. Top surface heights of the pillar patterns 69A can be adjusted to control depths of the control gate extensions 85A. That is, when top surfaces of the pillar patterns 69A are formed at a level lower than the bottom surfaces of the floating gates 75A, the lower regions of the control gate extensions 85A may extend to a level lower than the bottom surfaces of the floating gates 75A. When the pillars 69 are completely removed, the lower regions of the control gate extensions 85A may extend further into the isolation layer 65A.

A string select line SSL and a ground select line GSL crossing over the active regions 61 may be formed through a typical method that is well known to those skilled in the art. That is, the string select line SSL and the ground select line GSL may be formed when the control gate electrodes 85 are formed, or may be formed before or after the control gate electrodes 85 are formed. In addition, the string select line SSL and the ground select line GSL may each, for example, be formed of floating gates 75A and a control gate electrode 85 that are sequentially stacked. Tunneling dielectric layers 73 may be formed between the string select line SSL and an active region 61. In this case, a tunneling dielectric layer 73 may act as a gate dielectric layer of the string select transistor. Tunneling dielectric layers 73 may also be formed between the ground select line GSL and an active region 61. In this case, a tunnel dielectric layer 73 may act as a gate dielectric layer of the ground select transistor.

Impurity ions can be injected into the active regions 61 using the control gate electrodes 85 as ion implantation masks to form source and drain regions SD. Bit line impurity regions D and common source regions S as shown in FIG. 4 may be formed while the source and drain regions SD are formed.

Subsequently, the NAND flash memory device can be fabricated using typical fabrication processes such as formation of an interlayer-insulating layer, formation of a drain contact plug, and formation of a bit line.

A method of fabricating a NAND flash memory device in accordance with another embodiment of the present invention will now be described with additional reference to FIGS. 11 and 12.

Figure 11:
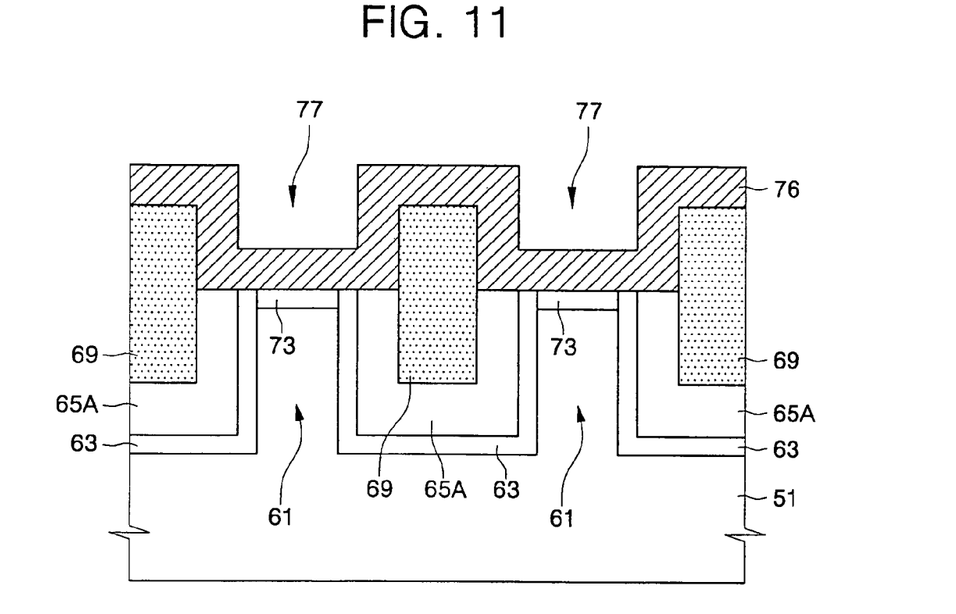
FIGS. 11 and 12 are cross-sectional views of the portion of the NAND flash memory device of FIG. 2 denoted by the line I-I' of FIG. 2 that illustrate stages in a method of fabricating a NAND flash memory device in accordance with another exemplary embodiment of the present invention, where the plane of cross section is perpendicular to the direction of the arrows I and I' of FIG. 2.

FIGS. 11 and 12 are cross-sectional views of the portion of the NAND flash memory device of FIG. 2 denoted by the line I-I' of FIG. 2 that illustrate stages in a method of fabricating a NAND flash memory device in accordance with another exemplary embodiment of the present invention, where the plane of cross section is perpendicular to the direction of the arrows I and I' of FIG. 2. Prior to reaching the stage of fabrication shown in FIG. 11, the active regions 61, the tunneling dielectric layers 73, the sidewall oxide layers 63, the isolation layer 65A, the pillars 69, and the grooves 70 are formed on the semiconductor substrate 51 of FIG. 11 by the same method illustrated in FIGS. 5 through 8. The method steps described hereinafter are primarily directed to the steps that differ from those of the previously described method for fabricating an exemplary embodiment of the invention.

Referring to FIGS. 8 and 11, a thin floating gate conductive layer 76 is formed on the semiconductor substrate 51 comprising the tunneling dielectric layers 73. The thin floating gate conductive layer 76 may be formed of doped polysilicon. Consequently, the thin floating gate conductive layer 76 can be formed on bottom surfaces and sidewalls of the grooves 70 so that floating gate grooves 77 can be formed.

A method of forming the floating gate 76A of FIG. 12 and the control gate electrode 85 will now be described with reference to FIG. 12.

Referring to FIGS. 11 and 12, the thin floating gate conductive layer 76 is planarized to expose top surfaces of the pillars 69. A CMP process which employs the pillars 69 as stops can be applied during the planarization process. Consequently, floating gate patterns 76A including the floating gate grooves 77 can be formed within the grooves 70 (of FIG. 8), and the floating gate patterns 76A can have widths larger than the widths of the top surfaces of the active regions 61.

Subsequently, the pillar patterns 69A, the inter-gate dielectric layer 83, the control gate electrodes 85, and the control gate extensions 85A may be formed by the same method as that described with reference to FIGS. 2, 3, 4 and 10. The floating gate patterns may be patterned while the control gate electrodes 85 are formed, so that floating gates 76A may be formed. The floating gate grooves 77 may remain on top surfaces of the floating gates 76A. The inter-gate dielectric layer 83 and the control gate electrodes 85 may also extend into the floating gate grooves 77.

The present invention is not limited to the embodiments described above, and various changes may be made while remaining within the scope of the present invention. For example, the present invention may also be applied to a NOR flash memory device and a method of fabricating the same.

In accordance with exemplary embodiments of the present invention as described above, an isolation layer is formed in trench regions that define a plurality of parallel active regions. Pillar patterns are formed within the isolation layer. Control gate electrodes crossing over the active regions are formed. Floating gates having widths larger than the top surfaces of the active regions are interposed at intersections of the control gate electrodes and the active regions. The control gate electrodes have control gate extensions which penetrate between the floating gates and are formed on the pillar patterns. Top surfaces of the pillar patterns can be formed at a level lower than bottom surfaces of the floating gates. Lower regions of the control gate extensions can extend to a level lower than the bottom surfaces of the floating gates. That is, the control gate extensions can penetrate between the floating gates to extend into the isolation layer.

Accordingly, the control gate extensions shield an electric field resulting from a potential difference between adjacent floating gates even when the adjacent floating gates have different electric potentials. That is, the control gate extensions can act to significantly reduce a parasitic coupling capacitance between the floating gates. Consequently, mutual disturbance between adjacent cell transistors adjacent can be prevented so that flash memory devices having high integration densities can be implemented.

Exemplary embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made to the exemplary embodiments of the present invention without departing from the scope of the present invention as set forth in the following claims.

What is claimed is:

1. A flash memory device, comprising:
   a plurality of isolation layer regions formed in a semiconductor substrate, wherein a plurality of parallel active regions are defined in the semiconductor substrate between the isolation layer regions;
   a plurality of floating gates formed above the active regions and having widths which are larger than widths of the active regions;
   pillar patterns located at a depth within the isolation layer regions, respectively, wherein a top surface of each of the pillar patterns is lower than a bottom surface of each of the floating gates; and
   a plurality of control gate electrodes overlapping the floating gates and crossing over the active regions,
   wherein each of the control gate electrodes includes control gate extensions which penetrate between the floating gates and are aligned over the pillar patterns, respectively.

2. The flash memory device according to claim 1, further comprising a sidewall oxide layer interposed between the active regions and the isolation layer.

3. The flash memory device according to claim 1, further comprising:
   a tunneling dielectric layer interposed between the active regions and the floating gates; and
   an inter-gate dielectric layer interposed between the floating gates and the control gate electrodes.

4. The flash memory device according to claim 1, wherein the floating gates have flat top surfaces.

5. The flash memory device according to claim 1, wherein top surfaces of the floating gates have floating gate grooves.

6. The flash memory device according to claim 1, wherein lower regions of the control gate extensions are lower than the bottom surfaces of the floating gates.

7. A NAND flash memory device, comprising:
   a plurality of isolation layer regions formed in a semiconductor substrate, wherein a plurality of parallel active regions are defined in the semiconductor substrate between the isolation layer regions;
   a string select line and a ground select line crossing over the active regions;
   a plurality of floating gates arranged between the string select line and the ground select line, disposed above the active regions, and having widths which are larger than widths of the active regions;
   pillar patterns located at a depth within the isolation layer regions, respectively, wherein a top surface of each of the pillar patterns is lower than a bottom surface of each of the floating gates; and
   a plurality of control gate electrodes overlapping the floating gates and crossing over the active regions,
   wherein each of the control gate electrodes includes control gate extensions which penetrate between the floating gates and are aligned over the pillar patterns, respectively.

8. The NAND flash memory device according to claim 7, further comprising a sidewall oxide layer interposed between the active regions and the isolation layer.

9. The NAND flash memory device according to claim 7, further comprising:
   a tunneling dielectric layer interposed between the active regions and the floating gates; and
   an inter-gate dielectric layer interposed between the floating gates and the control gate electrodes.

10. The NANID flash memory device according to claim 7, further comprising source and drain regions formed within the active regions between the floating gates.

11. The NAND flash memory device according to claim 7, wherein the floating gates have flat top surfaces.

12. The NAND flash memory device according to claim 7, wherein top surfaces of the floating gates have floating gate grooves.

13. The NAND flash memory device according to claim 7, wherein lower regions of the control gate extensions are lower than the bottom surfaces of the floating gates.